(12) United States Patent
Subramani et al.

(10) Patent No.: US 9,620,339 B2
(45) Date of Patent: Apr. 11, 2017

(54) SPUTTER SOURCE FOR SEMICONDUCTOR PROCESS CHAMBERS

(71) Applicant: APPLIED MATERIALS, INC., Santa Clara, CA (US)

(72) Inventors: Anantha K. Subramani, San Jose, CA (US); Tza-Jing Gung, San Jose, CA (US); Prashanth Kothnur, San Jose, CA (US); Hanbing Wu, Millbrae, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 261 days.

(21) Appl. No.: 13/836,328

(22) Filed: Mar. 15, 2013

(65) Prior Publication Data

US 2014/0262767 A1 Sep. 18, 2014

(51) Int. Cl.
*H01J 37/34* (2006.01)
*C23C 14/34* (2006.01)
*C23C 14/35* (2006.01)

(52) U.S. Cl.
CPC ........ *H01J 37/342* (2013.01); *C23C 14/3407* (2013.01); *C23C 14/35* (2013.01); *H01J 37/3405* (2013.01); *H01J 37/345* (2013.01); *H01J 37/3423* (2013.01); *C23C 14/3414* (2013.01); *H01J 37/34* (2013.01); *H01J 37/3402* (2013.01)

(58) Field of Classification Search
CPC .. H01J 37/345; H01J 37/3455; H01J 37/3402; H01J 37/3405; H01J 37/3411; H01J 37/3423; H01J 37/3435; H01J 37/3408; H01J 37/3452; H01J 37/342; C23C 14/3414; C23C 14/3407
See application file for complete search history.

(56) References Cited

U.S. PATENT DOCUMENTS

| 4,100,055 | A | * | 7/1978 | Rainey | 204/298.12 |
| 4,198,283 | A | * | 4/1980 | Class et al. | 204/298.12 |
| 6,287,435 | B1 | * | 9/2001 | Drewery | C23C 14/345 |
| | | | | | 204/298.06 |
| 6,776,881 | B2 | * | 8/2004 | Gruenenfelder et al. | 204/192.15 |

(Continued)

FOREIGN PATENT DOCUMENTS

JP 2000073164 A * 3/2000

*Primary Examiner* — Michael Band
(74) *Attorney, Agent, or Firm* — Moser Taboada; Alan Taboada

(57) ABSTRACT

Embodiments of a sputter source for semiconductor process chambers are provided herein. In some embodiments, a sputter source for a semiconductor process chamber may include: a target comprising a magnetic material to be deposited on a substrate, the magnetic material including a front surface where material is to be sputtered and an opposing back surface; and an outer magnet disposed proximate a back surface of the target and arranged symmetrically with respect to a central axis of the target, wherein the target has an annular groove formed in the back surface of the target disposed proximate the outer magnet to reduce a magnetic permeability of a region of the target proximate the outer magnet, wherein the groove is an unfilled v-shaped groove having an inner angle greater than 90 degrees.

8 Claims, 3 Drawing Sheets

(56) References Cited

U.S. PATENT DOCUMENTS

| | | | |
|---|---|---|---|
| 7,556,718 B2* | 7/2009 | Brcka | C23C 14/046 |
| | | | 204/192.1 |
| 2005/0236270 A1* | 10/2005 | Cheng et al. | 204/298.09 |
| 2008/0241409 A1* | 10/2008 | Guo et al. | 427/421.1 |
| 2011/0311735 A1* | 12/2011 | Wang et al. | 427/571 |

* cited by examiner

SPUTTER SOURCE FOR SEMICONDUCTOR PROCESS CHAMBERS

FIELD

Embodiments of the present invention generally relate to semiconductor processing equipment.

BACKGROUND

Conventional sputter sources utilized in depositing magnetic materials typically include a target fabricated from the magnetic material to be deposited. However, the inventors have observed that such magnetic materials may create a path of least resistance for magnetic fields produced by other magnetic components of the process chamber (e.g., magnets used to maintain a plasma), thereby affecting magnetic fields formed within the process chamber and creating non-uniformities within a plasma formed within the process chamber. To offset this, the thickness of the target may be reduced to minimize the effect on the magnetic field. However, the inventors have observed that because the target is consumed during sputtering, the reduced thickness of the target leads to a shortened target life.

Thus, the inventors have provided an improved sputter source for semiconductor process chambers.

SUMMARY

Embodiments of a sputter source for semiconductor process chambers are provided herein. In some embodiments, a sputter source for a semiconductor process chamber may include: a target comprising a magnetic material to be deposited on a substrate, the magnetic material including a front surface where material is to be sputtered and an opposing back surface; and an outer magnet disposed proximate a back surface of the target and arranged symmetrically with respect to a central axis of the target, wherein the target has an annular groove formed in the back surface of the target disposed proximate the outer magnet to reduce a magnetic permeability of a region of the target proximate the outer magnet, wherein the groove is an unfilled v-shaped groove having an inner angle greater than 90 degrees.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
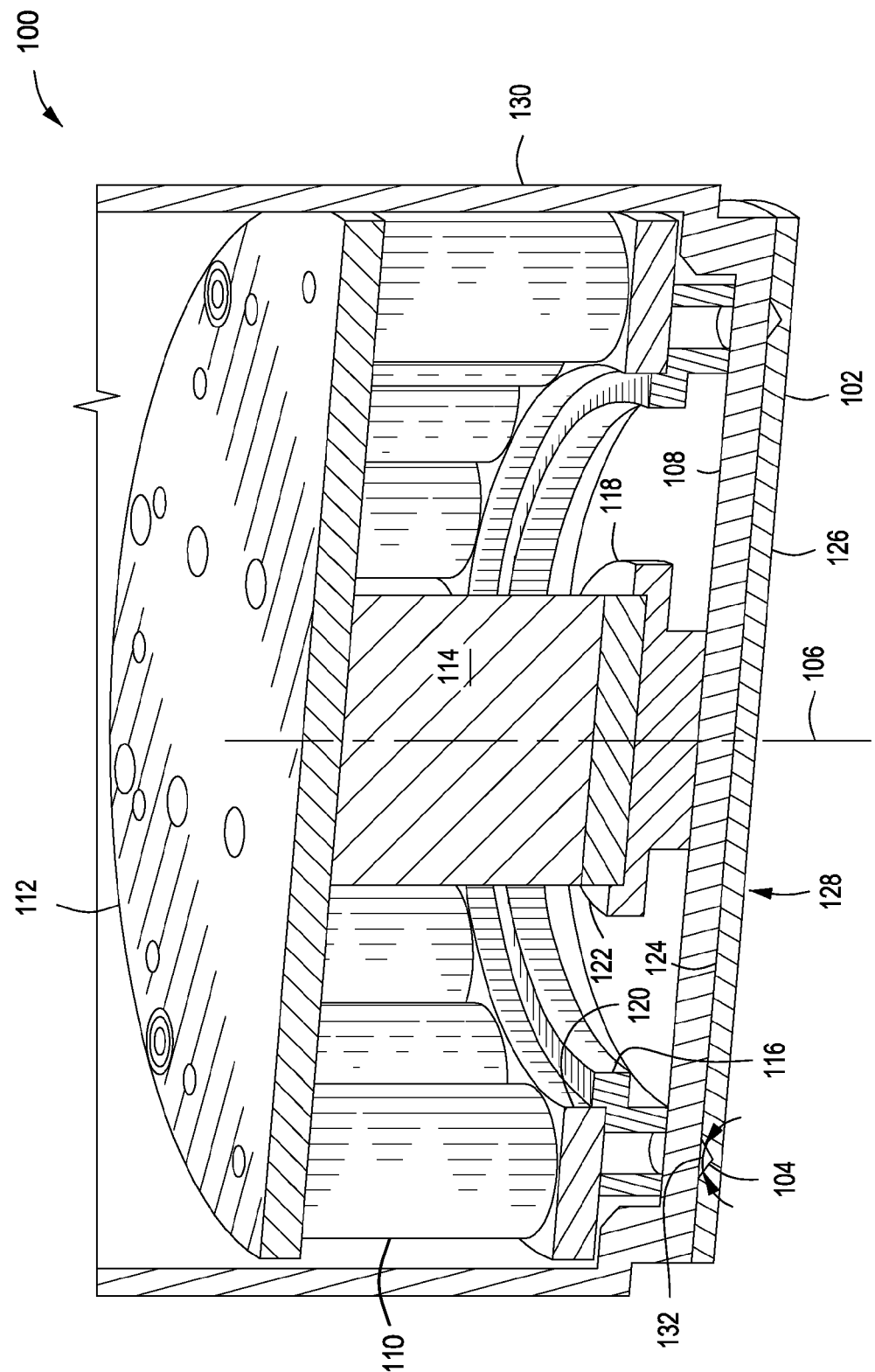
FIG. 1 depicts a sputter source for a semiconductor process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of sputter sources for semiconductor process chambers are provided herein. In at least some embodiments, the inventive sputter source may advantageously provide a target fabricated from a magnetic material having a longer useful life while reducing instances of adversely affecting magnetic fields within the process chamber formed by other process chamber components, as compared to conventionally used magnetic material sputter sources.

FIG. 1 depicts a sputter source for a semiconductor process chamber in accordance with some embodiments of the present invention. In some embodiments, the sputter source 100 may generally comprise a target 102 and an outer magnet 110 disposed proximate a back surface 124 of the target 102.

The outer magnet 110 produces a magnetic field to, for example, maintain and/or shape a plasma formed in a process chamber to facilitate a desired sputtering of material from the target 102 and subsequent deposition of the material atop a substrate disposed within the process chamber (e.g., the substrate 304 disposed in process chamber 300 described below with respect to FIG. 3). The outer magnet 110 may be any type of magnet suitable to form the desired magnetic field, for example such as a permanent magnet or an electromagnet. In addition, the outer magnet 110 may be arranged in any manner suitable to form the desired magnetic field. For example, in some embodiments, the outer magnet 110 may be annularly disposed symmetrically about a central axis 106 of the target 102. In such embodiments, the outer magnet 110 is disposed proximate the back surface 124 of the target 102 such that at least a portion of a magnetic field formed by the outer magnet 110 has an orientation that is substantially perpendicular to the back surface 124 of the target 102. Although described as an outer magnet 110 herein, the outer magnet 110 may comprise any amount of magnets suitable to produce a magnetic field having a desired shape and magnitude. For example, in some embodiments, the outer magnet 110 may comprise a plurality of magnets symmetrically disposed about the central axis 106 of the target 102, such as shown in FIG. 1.

In some embodiments, the sputter source 100 may include additional magnets, for example such as an inner magnet 114 disposed proximate the central axis 106 of the target 102. When present, the inner magnet 114 may facilitate shaping the magnetic field formed by the outer magnet 110. The inner magnet 114 may be any type of magnet suitable to form the desired magnetic field, for example such as a permanent magnet or an electromagnet.

The target 102 comprises a front surface 126 having a material to be deposited on a substrate and an opposing back surface 124, wherein a groove 104 is formed in the back surface 124 of the target 102. In some embodiments, the groove 104 is unfilled (e.g., no solid or liquid material is disposed within the groove 104). The target 102 may be fabricated from any suitable magnetic material suitable to be deposited on a substrate during a sputtering process. For example, in some embodiments, the target 102 may be fabricated from a nickel-iron alloy (NiFe), cobalt-iron alloy (CoFe), cobalt-iron-boron alloy (CoFeB), cobalt (Co), or the like.

The inventors have observed that providing the groove 104 in the back surface 124 of target 102 forms an area that is thinner than the surrounding portions of the target 102, thereby lowering the magnetic permeability of the target 102 proximate the groove 104. Lowering the magnetic permeability of the target 102 reduces or eliminates any adverse effect on a magnetic field formed by the outer magnet 110 that would otherwise be caused by a target 102 fabricated from a magnetic material not having the groove 104. In addition, the inventors have observed that the groove 104 may contain the magnetic field within an area 128 disposed within the groove 104, thereby substantially limiting the sputtering of the material from the target 102 to the area 128. As such, the target 102 may be fabricated such that area 128 within the groove 124 has a higher thickness as compared to conventionally utilized targets, thus providing a target 102 having a longer life as compared to conventional targets. For example, in some embodiments, the target 102 may have a thickness of up to about 0.75 inches.

The groove 104 may be formed having any shape and size suitable to sufficiently reduce the magnetic permeability of the target 102 in a desired location about the target 102, as discussed above. For example, in some embodiments, the groove 104 is a v-shaped groove having an inner angle 132 of at least 90 degrees. In some embodiments, the groove 104 may have a depth of about 0.02 inches to about 0.1 inch, or in some embodiments, about 0.12 inches. The groove 104 may be positioned in any manner suitable to reduce the magnetic permeability of the target 102 in a desired location. For example, in some embodiments, the groove 104 may be annularly disposed about the back surface 124 of the target 102 and positioned such that when the target 102 is coupled to the sputter source 100, the groove 104 is disposed in an area proximate the outer magnet 110 (e.g., beneath the outer magnet 110, such as shown in FIG. 1).

In some embodiments, a backing plate 108 may be disposed between the outer magnet 110 and the target 102 to support the target 102 and/or couple the target 102 to the sputter source 100. In some embodiments, the backing plate 108 may comprise a conductive material, such as copper-zinc, copper-chrome, or the same material as the target 102, such that RF and DC power can be coupled to the target 102 via the backing plate 108. Alternatively, the backing plate 108 may be non-conductive and may include conductive elements (not shown) such as electrical feedthroughs or the like. In some embodiments, the backing plate 108 may comprise one or more temperature control mechanisms to control a temperature of the sputter source 100 and/or target 102. For example, in some embodiments, the backing plate 108 may include one or more channels formed within the backing plate 108 to flow a temperature control fluid through the backing plate 108.

In some embodiments, the sputter source 100 may comprise an enclosure 130 surrounding a plurality of the outer magnets 110. In such embodiments, the backing plate 108 may be coupled to the enclosure 130 to facilitate coupling the target 102 to the sputter source 100. Although described as two components, the backing plate 108 and enclosure 130 may be fabricated from a single piece of material, thereby providing a unitary design comprising both the backing plate 108 and enclosure 130.

In some embodiments, the outer magnet 110 and the inner magnet 114 may be disposed between a top plate 112 and a bottom ring 120 and bottom plate 122 to secure the outer magnet 110 and inner magnet 114 in a desired position within the sputter source 100. In some embodiments, for example, where the sputter source 100 is retrofit into a preexisting enclosure (e.g., enclosure 130), a plurality of spacers (two spacers 116, 118 shown) may be utilized to securely fit the outer magnet 110 and inner magnet 114 within the enclosure 130.

Although shown as a plate in FIG. 1, the target 102 may have any shape suitable to sputter material for a desired application. For example, referring to FIG. 2, in some embodiments, the target 202 may comprise a ring 242 having a top 232 and a bottom 244 and a lip 236 that extends radially inward from the ring 242 coupled to the top 232 of the ring 242 (e.g., having a substantially "L" shaped cross section). In such embodiments, a first groove 218 may be formed in a back surface 240 of the ring 242 and a second groove 216 may be formed in a back surface 238 of the lip 236. In some embodiments, the lip 236 may be substantially perpendicular to the ring 242.

In some embodiments, a first set of outer magnets 248 may be disposed proximate the back surface 240 of the ring 242 and a second set of outer magnets 246 may be disposed proximate the back surface 238 of the lip 236. In some embodiments, each of the first set of outer magnets 248 and the second set of outer magnets 246 may be disposed symmetrically with respect to a central axis 234 of the target 202.

Each of the first set of outer magnets 248 and second set of outer magnets 246 may comprise any number of magnets suitable to form a desired magnetic field. For example, in some embodiments, the first set of outer magnets 248 may comprise two ring shaped magnets 208, 210 that extend peripherally about the back surface 240 of the ring 242. In such embodiments, each of the two ring shaped magnets 208, 210 may be oriented such that opposing poles of each of the two ring shaped magnets 208, 210 are adjacent to one another, thereby forming a first magnetic loop 241, wherein at least a portion of the first magnetic loop 241 is perpendicular to the ring 242. In some embodiments, the second set of outer magnets 246 may comprise two ring shaped magnets 212, 214 disposed annularly proximate the back surface 238 of the lip 236. In such embodiments, each of the two ring shaped magnets 212, 214 may be oriented such that opposing poles of each of the two ring shaped magnets 212, 214 are adjacent to one another, thereby forming a second magnetic loop 260, wherein at least a portion of the second magnetic loop 241 is perpendicular to the lip 236. In some embodiments, a magnetic backing plate 230 may be disposed atop the set outer magnets 248 and second set of outer magnets 246 to facilitate forming the first magnetic loop 241 and the second magnetic loop 260. When arranged as described in the above embodiments, the first magnetic loop 241 and the second magnetic loop 260 form a confined magnetic field 228 that extends away from the target 202 and towards a substrate disposed beneath the sputter source 100. The inventors have observed that the aforementioned confinement of the magnetic field may facilitate ionization of process gas species within the process chamber to form at least a portion of the plasma, thereby offsetting a low power density and low plasma density caused by a large area of the first set of outer magnets 248 and second set of outer magnets 246.

In some embodiments, each of the first groove 218 and second groove 216 may be unfilled (e.g., no solid or liquid material is disposed within the first groove 218 and second groove 216). The inventors have observed that providing the first groove 218 and second groove 216 lowers the magnetic permeability of the target 202 proximate each of the first groove 218 and the second groove 216 thereby reducing or eliminating any adverse effect on a magnetic field (e.g., magnetic field 228) formed by the outer magnet 110 that would otherwise be caused by a target 202 fabricated from a magnetic material not having the first groove 218 and second groove 216, for example, such as described above with respect to the groove 104 formed in the back surface 124 of the target 102 shown in FIG. 1. In addition, the inventors have observed that the first groove 218 and second groove 216 may contain the magnetic field 228 within an area 262 disposed between the first groove 218 and second groove 216, thereby substantially limiting the sputtering of the material from the target 202 to the area 262. As such, the target 202 may be fabricated such that the area 262 disposed between the first groove 218 and second groove 216 has a higher thickness as compared to conventionally utilized targets, thus providing a target 202 having a longer life as compared to conventional targets. For example, in some embodiments, the area 262 disposed between the first groove 218 and second groove 216 may have a thickness of up to about 0.75 inches. In addition, the inventors have observed that material that is sputtered outside of the area 262 (e.g., from the ring 242 and lip 236) and not directed towards the substrate may redeposit on the ring 242 and/or lip 236, thereby extending the life of the target 202.

Figure 2:
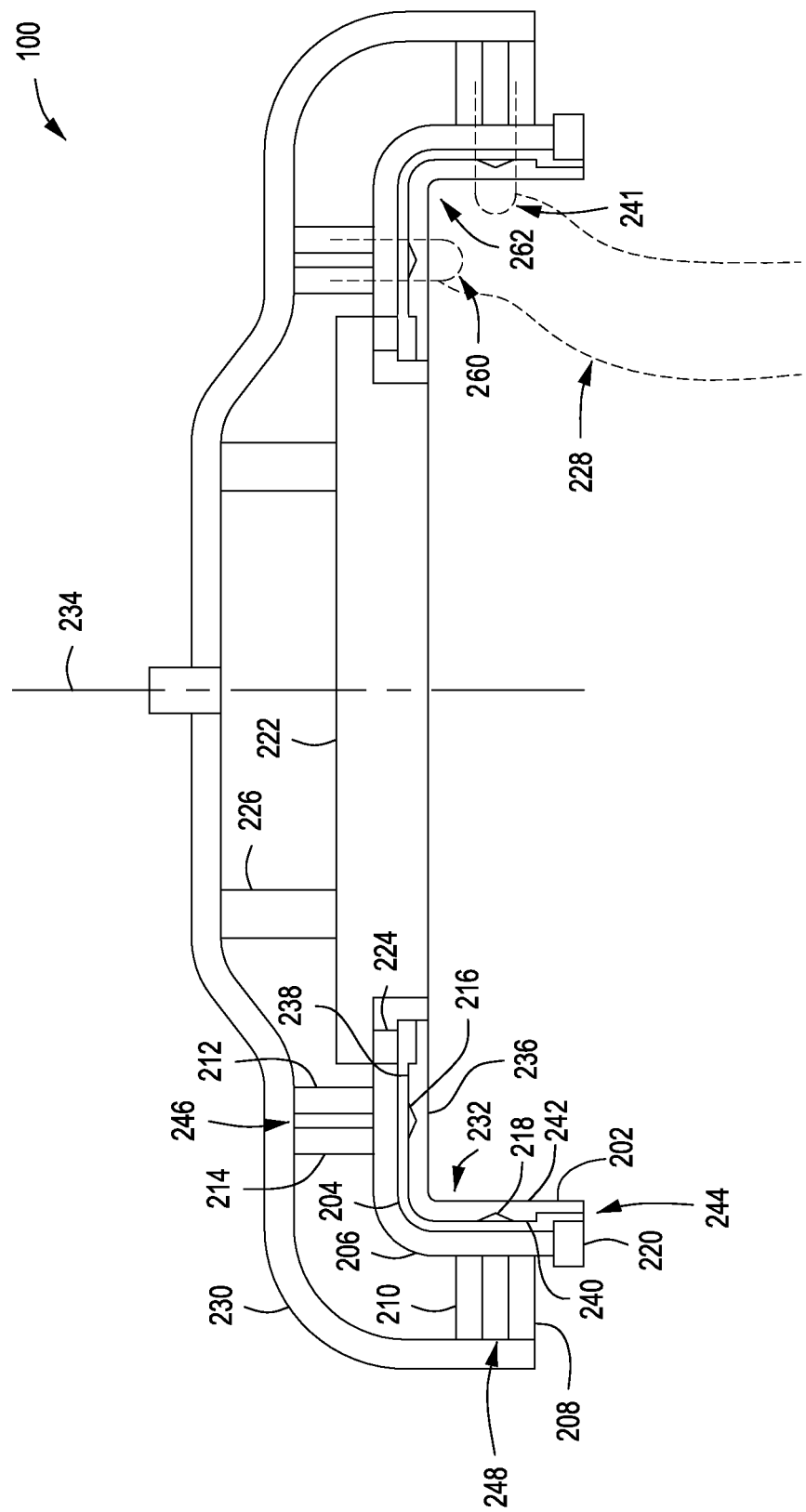
FIG. 2 depicts a sputter source for a semiconductor process chamber in accordance with some embodiments of the present invention.

The first groove 218 and second groove 216 may be formed having any shape and size suitable to sufficiently reduce the magnetic permeability of the target 202 in a desired location about the target 202, for example, such as the sizes and shapes of the groove 104 discussed above. In addition, the first groove 218 and second groove 216 may be positioned in any manner suitable to reduce the magnetic permeability of the target 202 in a desired location. For example, in some embodiments, the first groove 218 and second groove 216 may be positioned such that when the target 202 is coupled to the sputter source 100, the first groove 218 and the second groove 216 is disposed proximate the first set of outer magnets 248 and second set of outer magnets 246, respectively, such as shown in FIG. 2. In such embodiments, the first groove 218 and second groove 216 may be positioned such that when the target 202 is coupled to the sputter source 100, the first groove 218 and the second groove 216 is disposed directly beneath the first set of outer magnets 248 and second set of outer magnets 246, respectively.

In some embodiments, a backing plate 204 may be disposed between the outer magnets (the first set of outer magnets 248 and second set of outer magnets) and the target 202 to support the target 202 and/or couple the target 202 to the sputter source 100. The backing plate 204 may be fabricated from any suitable material, for example, such as the materials described above with respect to the backing plate 108 of FIG. 1. In some embodiments, a cooling jacket 206 may be disposed between the outer magnets (the first set of outer magnets 248 and second set of outer magnets) and the backing plate 204 to facilitate control over a temperature of the target 202. In such embodiments, the cooling jacket 206 may include one or more channels formed within the cooling jacket 206 to flow a temperature control fluid provided by a fluid source 220 through the backing plate 108. In some embodiments, a total thickness of the target 202, cooling jacket 206 and backing plate 204 may be adjusted to maximize the structural strength and life of the target 202. For example, in some embodiments, the target 202, cooling jacket 206 and backing plate 204 may have a combined thickness of about 1 inches to about 2 inches.

In some embodiments, the sputter source 100 may include additional magnets, for example such as an inner magnet 226 disposed symmetrically about the central axis 234 of the target 202. When present, the inner magnet 226 may facilitate shaping the magnetic field 228 formed by the first set of outer magnets 248 and second set of outer magnets 246. The inner magnet 226 may be any type of magnet suitable to form the desired magnetic field, for example such as a permanent magnet or an electromagnet. In some embodiments, the inner magnet 226 may be supported by a plate 222. In some embodiments, the plate 222 may be supported by a portion of the target 202. In such embodiments, a nonconductive spacer 224 may be disposed between the plate 222 and the target 202 to electrically isolate the plate 222 from the target 202

Figure 3:
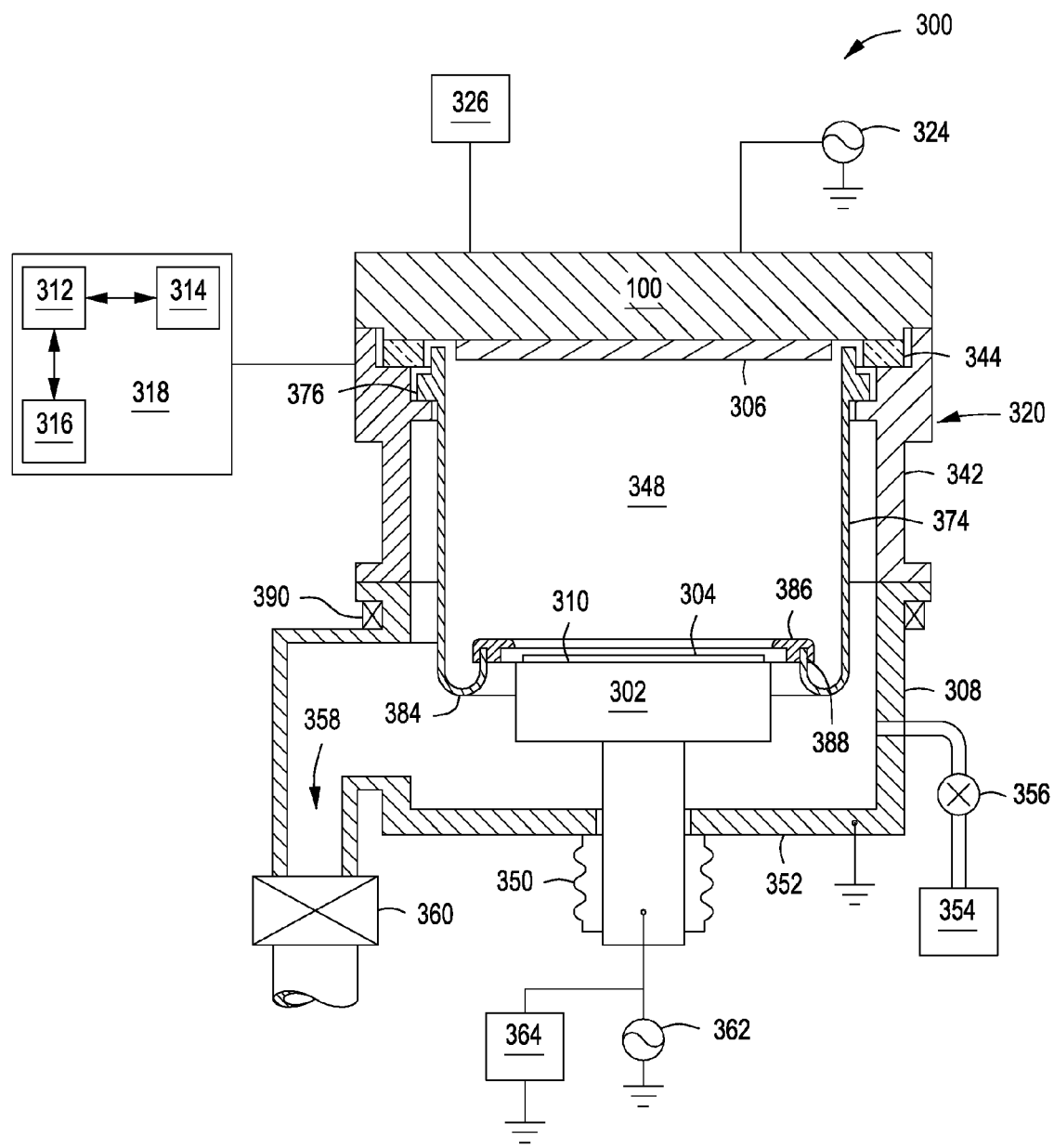
FIG. 3 depicts a semiconductor process chamber suitable for use with a sputter source in accordance with some embodiments of the present invention.

FIG. 3 depicts a process chamber suitable for use with a sputter source in accordance with some embodiments of the present invention. The process chamber may be any type of process chamber suitable for semiconductor processing that utilizes a sputter source. Examples of suitable process chambers include the ALPS® Plus and SIP ENCORE® PVD process chambers, both commercially available from Applied Materials, Inc., of Santa Clara, Calif. Other process chambers from Applied Materials, Inc. or other manufactures may also benefit from the inventive method disclosed herein.

In some embodiments, the process chamber 300 may generally include a chamber body 320 having a substrate support pedestal 302 for receiving a substrate 304 thereon, and a sputter source 100 (e.g., sputter source 100 described above) having a target 306. The substrate support pedestal 302 may be located within a grounded enclosure wall, which may be the chamber wall 308 (as shown) or a grounded shield. In some embodiments, the sputter source 100 may be supported on a grounded conductive aluminum adapter (adapter) 342 through a dielectric isolator 344.

Any number of power sources may be utilized to provide power to the target 306 to accommodate for a particular application or process performed in the process chamber 300. For example, in some embodiments, a DC power source 326 and RF power source 324 may provide DC power and RF power, respectively, to the target 306 via a source distribution plate (not shown), such as the backing plate 108 described above. In such embodiments, the DC power source 326 may be utilized to apply a negative voltage, or bias, to the target 306. In some embodiments, RF energy supplied by the RF power source 324 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies.

The substrate support pedestal 302 has a substrate support surface 310 facing the principal surface of the target 306 and supports the substrate 304 to be processed. The substrate support pedestal 302 may support the substrate 304 in a processing volume 348 of the process chamber 300. The processing volume 348 is defined as the region above the substrate support pedestal 302 during processing (for example, between the target 306 and the substrate support pedestal 302 when in a processing position).

In some embodiments, the substrate support pedestal 302 may be vertically movable through a bellows 350 connected to a bottom chamber wall 352 to allow the substrate 304 to be transferred onto the substrate support pedestal 302 through a load lock valve (not shown) in the lower portion of processing the process chamber 300 and thereafter raised to one or more positions for processing (e.g., as described above).

One or more processing gases may be supplied from a gas source 354 through a mass flow controller 356 into the lower part of the process chamber 300. An exhaust port 358 may be provided and coupled to a pump (not shown) via a valve 360 for exhausting the interior of the process chamber 300 and facilitating maintaining a desired pressure inside the process chamber 300.

In some embodiments, one or more power sources (an RF power source 362 and DC power source 364 shown) may be coupled to the substrate support pedestal 302. When present, the RF power source 362 may be coupled to the substrate support pedestal 302 to induce a negative DC bias on the substrate 304. In addition, in some embodiments, a negative DC self-bias may form on the substrate 304 during processing.

In some embodiments, the process chamber 300 may further include a process kit shield 374 connected to a ledge 376 of the adapter 342. The adapter 342 in turn is sealed and grounded to the chamber wall 308. Generally, the process kit shield 374 extends downwardly along the walls of the adapter 342 and the chamber wall 308 downwardly to below an upper surface of the substrate support pedestal 302 and returns upwardly until reaching an upper surface of the substrate support pedestal 302 (e.g., forming a u-shaped portion 384 at the bottom). Alternatively, the bottommost portion of the process kit shield need not be a u-shaped portion 384 and may have any suitable shape. A cover ring 386 rests on the top of an upwardly extending lip 388 of the process kit shield 374. An additional deposition ring (not shown) may be used to shield the periphery of the substrate 304 from deposition.

In some embodiments, a magnet 390 may be disposed about the process chamber 300 for selectively providing a magnetic field between the substrate support pedestal 302 and the target 306. For example, as shown in FIG. 3, the magnet 390 may be disposed about the outside of the chamber wall 308 in a region just above the substrate support pedestal 302. In some embodiments, the magnet 390 may be disposed additionally or alternatively in other locations, such as adjacent the adapter 342. The magnet 390 may be an electromagnet and may be coupled to a power source (not shown) for controlling the magnitude of the magnetic field generated by the electromagnet. When present, the magnet 390 may be configured to provide a uniform magnetic field proximate the substrate 304 to facilitate coercing the material sputtered from the target 306 in desired orientation prior to, during, or subsequent to, deposition of the material atop the substrate 304.

A controller 318 may be provided and coupled to various components of the process chamber 300 to control the operation thereof. The controller 318 includes a central processing unit (CPU) 312, a memory 314, and support circuits 316. The controller 318 may control the process chamber 300 directly, or via computers (or controllers) associated with particular process chamber and/or support system components. The controller 318 may be one of any form of general-purpose computer processor that can be used in an industrial setting for controlling various chambers and sub-processors. The memory, or computer readable medium, 314 of the controller 318 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 316 are coupled to the CPU 312 for supporting the processor in a conventional manner. These circuits include cache, power supplies, clock circuits, input/output circuitry and subsystems, and the like. One or more processes may be stored in the memory 314 as software routine that may be executed or invoked to control the operation of the process chamber 300 in the manner described herein. The software routine may also be stored and/or executed by a second CPU (not shown) that is remotely located from the hardware being controlled by the CPU 312.

Thus, embodiments of a sputter source have been provided herein. In at least some embodiments, the inventive sputter source may advantageously reduce instances of adversely affecting magnetic fields within the process chamber formed by other process chamber components, as compared to conventionally used magnetic material sputter sources.

While the foregoing is directed to embodiments of the present invention, other and further embodiments of the invention may be devised without departing from the basic scope thereof.

The invention claimed is:

1. A sputter source for a semiconductor process chamber, comprising:
   a target comprising a magnetic material to be deposited on a substrate, the magnetic material including a front surface where material is to be sputtered and an opposing back surface, wherein the target has a central axis normal to the back surface of the target and comprises a ring extending downward and having a top portion and a bottom portion and a hp extending radially inward from and perpendicular to the top portion;
   a first set of outer magnets disposed proximate a back surface of the ring and arranged symmetrically with respect to the central axis; and
   a second set of outer magnets disposed proximate a back surface of the lip and arranged symmetrically with respect to the central axis, wherein the target comprises;
   a first annular groove formed in the back surface of the ring directly opposing and aligned with the first set of outer magnets to reduce a magnetic permeability of a first region of the target proximate the first set of outer magnets; and
   a second annular groove formed in the back surface of the lip directly opposing and aligned with the second set of outer magnets to reduce a magnetic permeability of a second region of the target proximate the second set of outer magnets,
   wherein each of the first and second annular grooves is an unfilled v-shaped groove having an inner angle greater than 90 degrees, and
   wherein the front surface of the ring is perpendicular to the front surface of the lip so that the target has a substantially L-shaped cross section.

2. The sputter source of claim 1, wherein the first set of outer magnets comprise two ring shaped magnets disposed peripherally about the back surface of the ring.

3. The sputter source of claim 2, wherein the two ring shaped magnets are oriented such that opposing poles of each of the two ring shaped magnets are adjacent to one another to form a first magnetic loop, wherein at least a portion of the first magnetic loop is perpendicular to the back surface of the ring.

4. The sputter source of claim 1, wherein the second set of outer magnets comprise two ring shaped magnets disposed annularly proximate a back surface of the lip.

5. The sputter source of claim 4, wherein the two ring shaped magnets are oriented such that opposing poles of each of the two ring shaped magnets are adjacent to one another to form a second magnetic loop, wherein at least a portion of the second magnetic loop is perpendicular to the back surface of the lip.

6. The sputter source of claim 1, wherein a portion of the target between the lip and the ring has a thickness that is greater than a thickness of the lip and a thickness of the ring.

7. The sputter source of claim 1, further comprising:
a conductive plate partially disposed within the ring, wherein the conductive plate is supported by at least a portion of the target.

8. The sputter source of claim 7, further comprising:
an isolator disposed between the conductive plate and the ring to electrically isolate the conductive plate from the ring.

* * * * *

UNITED STATES PATENT AND TRADEMARK OFFICE
CERTIFICATE OF CORRECTION

PATENT NO.        : 9,620,339 B2                                    Page 1 of 1
APPLICATION NO.   : 13/836328
DATED             : April 11, 2017
INVENTOR(S)       : Subramani et al.

It is certified that error appears in the above-identified patent and that said Letters Patent is hereby corrected as shown below:

In the Claims

In Column 8 Line 29, Claim 1 delete "hp" and insert in its place -- lip --.

Signed and Sealed this
Fourth Day of July, 2017

Joseph Matal
*Performing the Functions and Duties of the
Under Secretary of Commerce for Intellectual Property and
Director of the United States Patent and Trademark Office*